United States Patent
Jin et al.

(10) Patent No.: US 10,439,306 B2
(45) Date of Patent: Oct. 8, 2019

(54) ELECTRICAL CONTACT TERMINAL

(71) Applicant: Molex, LLC, Lisle, IL (US)

(72) Inventors: Jang Bum Jin, Ansan (KR); Ji-Su Shin, Ansan (KR); Sa-cheol Hong, Ansan (KR)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/032,251

(22) Filed: Jul. 11, 2018

(65) Prior Publication Data
US 2019/0020129 A1 Jan. 17, 2019

(30) Foreign Application Priority Data

Jul. 12, 2017 (KR) .................. 10-2017-0088521

(51) Int. Cl.
| | | |
|---|---|---|
| *H01R 12/00* | (2006.01) | |
| *H01R 12/57* | (2011.01) | |
| *H01R 4/48* | (2006.01) | |
| *H01R 12/52* | (2011.01) | |
| *H01R 13/193* | (2006.01) | |

(Continued)

(52) U.S. Cl.
CPC .............. *H01R 12/57* (2013.01); *H01R 4/48* (2013.01); *H01R 4/4818* (2013.01); *H01R 12/52* (2013.01);
(Continued)

(58) Field of Classification Search
CPC .......... H01R 13/113; H01R 4/16; H01R 4/02; H01R 13/115; H01R 12/57; H01R 12/718; H01R 13/11
See application file for complete search history.

(56) References Cited

U.S. PATENT DOCUMENTS 6,080,008 A * 6/2000 Frantz ................. H01R 4/4881
439/441
6,193,567 B1 * 2/2001 Hsieh ..................... H01R 43/16
439/84

(Continued)

FOREIGN PATENT DOCUMENTS

CN 204441542 U 1/2015
JP 2005-537617 A 12/2005

(Continued)

OTHER PUBLICATIONS

Extended European Search Report received for European Patent Application No. 18182310.5, dated Nov. 27, 2018, 9 pages.

(Continued)

*Primary Examiner* — Xuong M Chung Trans
(74) *Attorney, Agent, or Firm* — Molex, LLC

(57) ABSTRACT

The present disclosure relates to a vertical connection type contact terminal of a wire to board connector, which enables a wire to be connected in a vertical direction, and the present disclosure has a terminal formed in a horseshoe shape ('⊃') by bending both ends of a back plate of a sheet shape toward a front surface and having one side opened, includes: one pair of support plates which bend from both ends of the back plate and define a wire insertion space therebetween, and have mounting portions formed on lower ends thereof to be mounted on a substrate; and one pair of connection plates which bend from upper ends of the one pair of support plates toward the wire insertion space inside, and connect and lock a wire, and is mounted on the substrate in an upright position to allow the wire to be connected in a vertical direction.

12 Claims, 6 Drawing Sheets

(51) Int. Cl.
*H05K 3/34* (2006.01)
*H01R 4/26* (2006.01)
*H01R 12/51* (2011.01)
*H01R 13/115* (2006.01)

(52) U.S. Cl.
CPC ........... H01R 13/193 (2013.01); H05K 3/341 (2013.01); *H01R 4/26* (2013.01); *H01R 12/515* (2013.01); *H01R 13/115* (2013.01); *H05K 2201/10007* (2013.01); *H05K 2201/10431* (2013.01)

(56) References Cited

U.S. PATENT DOCUMENTS

| | | | |
|---|---|---|---|
| 7,699,496 | B2 | 4/2010 | Miyazono |
| 9,634,413 | B2 * | 4/2017 | Hashiguchi ............ H01R 13/11 |
| 9,673,542 | B1 | 6/2017 | Decker |
| 2014/0120786 | A1 | 5/2014 | Bishop |

FOREIGN PATENT DOCUMENTS

| | | |
|---|---|---|
| KR | 20-1995-0023978 U | 8/1995 |
| KR | 10-2006-0120330 A | 11/2006 |
| WO | WO 2012-168504 A1 | 12/2012 |
| WO | WO 2013-176859 A1 | 11/2013 |

OTHER PUBLICATIONS

Office Action received for Korean Patent Application No. 10-2017-0088521, dated Oct. 25, 2018, 8 pages. (4 pages of English Translation and 4 pages of Official Copy).

* cited by examiner

ELECTRICAL CONTACT TERMINAL

RELATED APPLICATIONS

This application claims priority to Korean Application No. 10-2017-0088521, filed Jul. 12, 2017, which is incorporated herein by reference in its entirety.

TECHNICAL FIELD

The present disclosure relates to a wire to board connector, and more particularly, to a vertical connection type electrical contact terminal of a wire to board connector, which enables a wire to be connected in a vertical direction.

BACKGROUND ART

In general, a wire to board connector refers to a connector that is used to connect a wire of an electronic/electric device and a printed circuit board with each other. One of the connectors that brings a wire into contact with a terminal and locks the wire into the terminal simply by inserting the wire into the terminal is referred to as a poke-in connector.

A related-art poke-in connector is introduced in International Patent Publication No. WO2013/176859 with the title "Electrical connector having poke-in wire contact." The connector of the prior art document has a structure in which a contact terminal and a wire insertion port of an insulation housing are arranged in a horizontal direction parallel with a substrate surface, and a wire is inserted in the horizontal direction through the wire insertion port and is connected to the contact terminal.

That is, the related-art wire to board connector has a horizontal connection structure, and the horizontal connection structure requires a large mounting area between the contact terminal and the substrate. Therefore, there is a disadvantage that the related-art wire to board connector is not easily applied to a substrate having a small area.

Patent Document 1: International Patent Publication No. WO2013/176859

SUMMARY

The present disclosure has been suggested to solve the above-mentioned problem, and an object of the present disclosure is to provide a contact terminal for a wire to board connector of a vertical connection structure having a small mounting area, which can be easily applied to a substrate of a small size.

To achieve the above-described object, an electrical contact terminal of the present disclosure has a terminal formed in a horseshoe shape ('⊃') by bending both ends of a back plate of a sheet shape toward a front surface and having one side opened, and the electrical contact terminal includes: one pair of support plates which bend from both ends of the back plate and define a wire insertion space therebetween, and have mounting portions formed on lower ends thereof to be mounted on a substrate; and one pair of connection plates which bend from upper ends of the one pair of support plates toward the wire insertion space inside, and connect and lock a wire. The electrical contact terminal is mounted on the substrate in an upright position to allow the wire to be connected in a vertical direction.

In addition, each of the connection plates may form a two-step bending structure including a first bending portion bending from an upper end of the support plate, an elastic portion extending from the first bending portion, a second bending portion bending from an end of the elastic portion, and a locking portion extending from the second bending portion.

In addition, a cross section interior angle of an end of the locking portion to be brought into contact with the wire may range from 65° to 80°.

In addition, each of the connection plates may further include an extension portion protruding from the locking portion toward the front surface.

In addition, each of the support plates may further include a movement prevention portion which is formed by cutting a portion of a plate on a lower side spaced apart from the locking portion, and bends inward.

The contact terminal of the present disclosure stands upright on the substrate and allows the wire to be inserted through the wire insertion port formed on an upper end thereof. Therefore, there is an effect that a mounting area is reduced, and the contact terminal is easily applied to a substrate of a small size.

DETAILED DESCRIPTION OF THE PREFERRED EMBODIMENTS

The present disclosure and the technical objects achieved by embodiments of the present disclosure will be more apparent by preferred embodiments of the present disclosure which will be described below. Hereinafter, preferred embodiments of the present disclosure will be described in detail with reference to the accompanying drawings.

Figure 1:
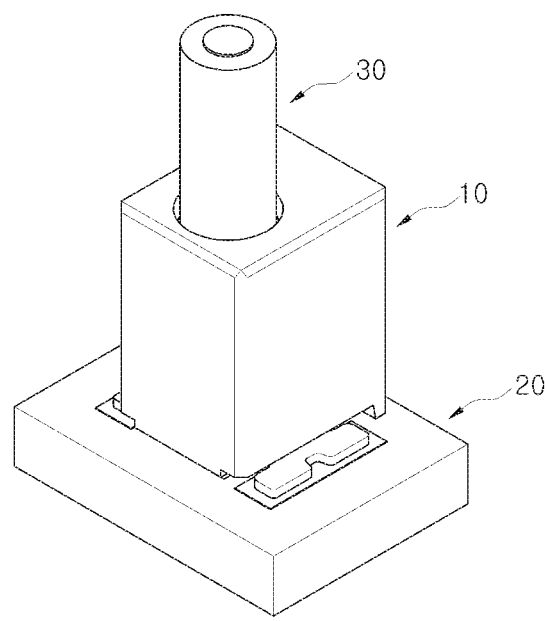
FIG. 1 is a perspective view showing a connector according to an exemplary embodiment of the present disclosure.
Figure 2:
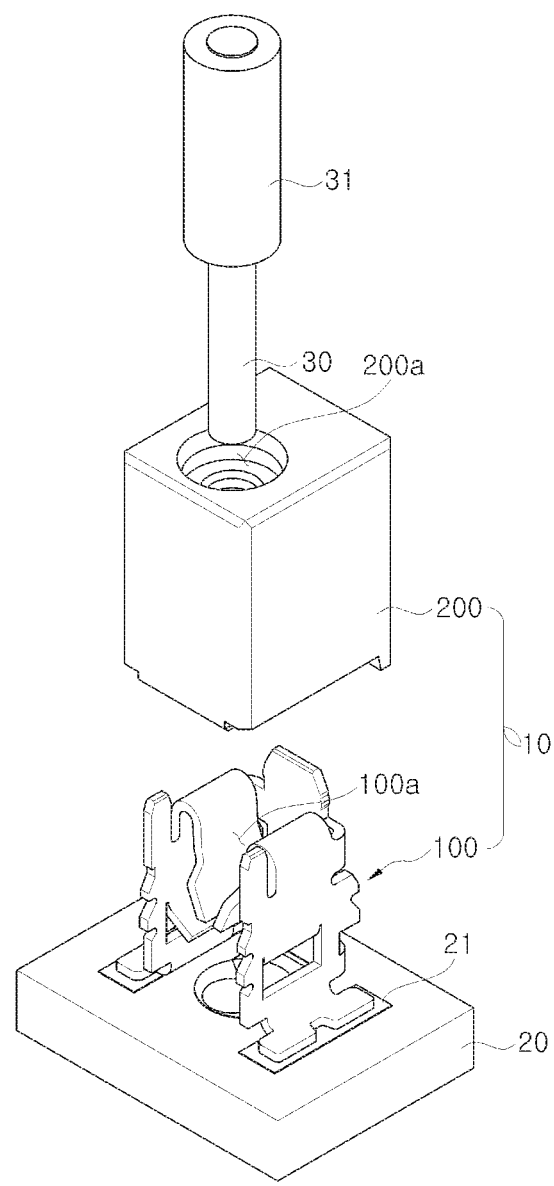
FIG. 2 is an exploded perspective view showing the connector of FIG. 1.

FIG. 1 is a perspective view showing a connector according to an exemplary embodiment of the present disclosure, and FIG. 2 is an exploded perspective view showing the connector of FIG. 1.

As shown in these drawings, the connector 10 according to an exemplary embodiment of the present disclosure is a device that accommodates a wire 30 while being mounted on a substrate 20, and electrically connects the wire 30 and the substrate 20 with each other, and may include a contact terminal 100 mounted on the substrate 20. and a housing 200 protecting the contact terminal 100 by surrounding the same. The contact terminal 100 may have a plurality of terminals formed on a lower end thereof to be mounted on the substrate 20 and may have a wire insertion port 100a formed an upper end thereof to receive the wire 30. Accordingly, the connector 10 of the present disclosure has a vertical connection structure in which the contact terminal 100 for electric connection stands upright on an upper surface of the substrate 20, and the wire 30 is inserted downward in a vertical direction.

The substrate 20 may have various elements mounted therein for driving an electric device and may have circuits for electrical connection of each element printed on the surface thereof, and in particular, may have at least one pair of mounting pads 21 to allow the contact terminal 100 to be mounted thereon. The wire 30 may be exposed to the outside of an insulation sheath 31 by a predetermined length and may be inserted into the contact terminal 100. The housing 200 may have a hexahedron container shape having a lower side opened to correspond to an exterior of the contact terminal 100 and may have a wire insertion port 200a formed on an upper surface thereof to allow the wire 30 to be inserted therethrough.

In the connector 10 having the above-described configuration, the housing 200 is coupled to the contact terminal 100 while surrounding the contact terminal 100, and then the contact terminal 100 is mounted on the substrate 20 by a process such as soldering, etc. The wire 30 is inserted into the connector 10 mounted on the substrate 20 from the upper side through the wire insertion ports 200a, 100a of the housing 200 and the contact terminal 100, and is locked into the contact terminal 100, such that an electrical connection between the substrate 20 and the wire 30 is achieved.

Figure 3:
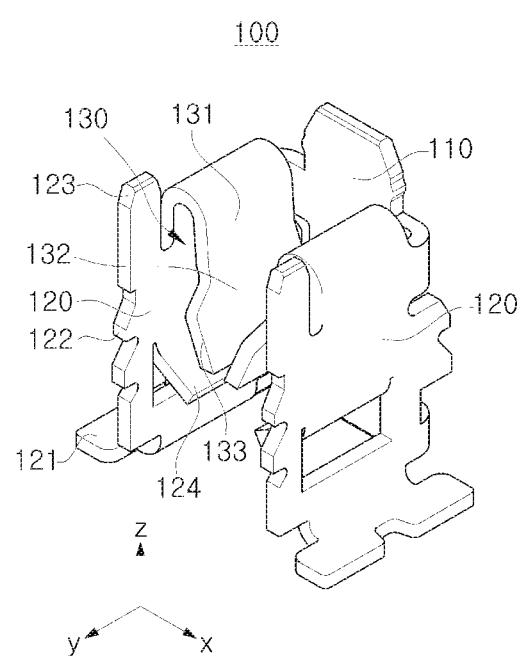
FIG. 3 is a perspective view showing a contact terminal according to an exemplary embodiment of the present disclosure.
Figure 4:
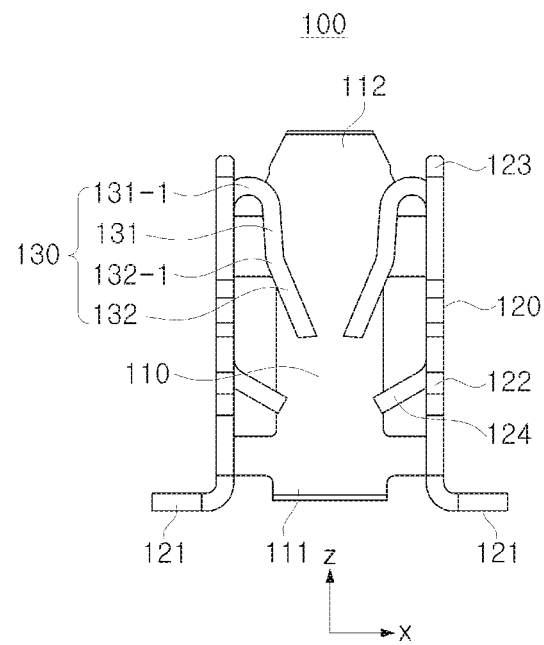
FIG. 4 is a front view showing the contact terminal of FIG. 3.
Figure 5:
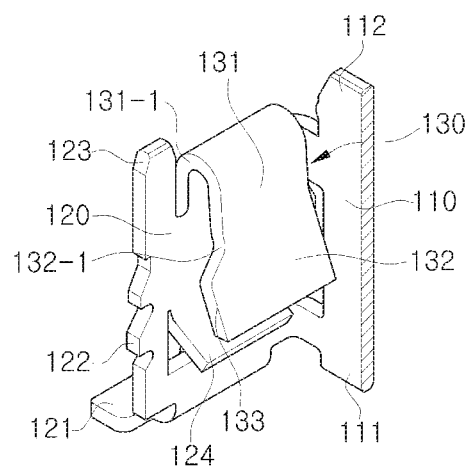
FIG. 5 is a partial cross-sectional view showing the contact terminal of FIG. 3.
Figure 6:
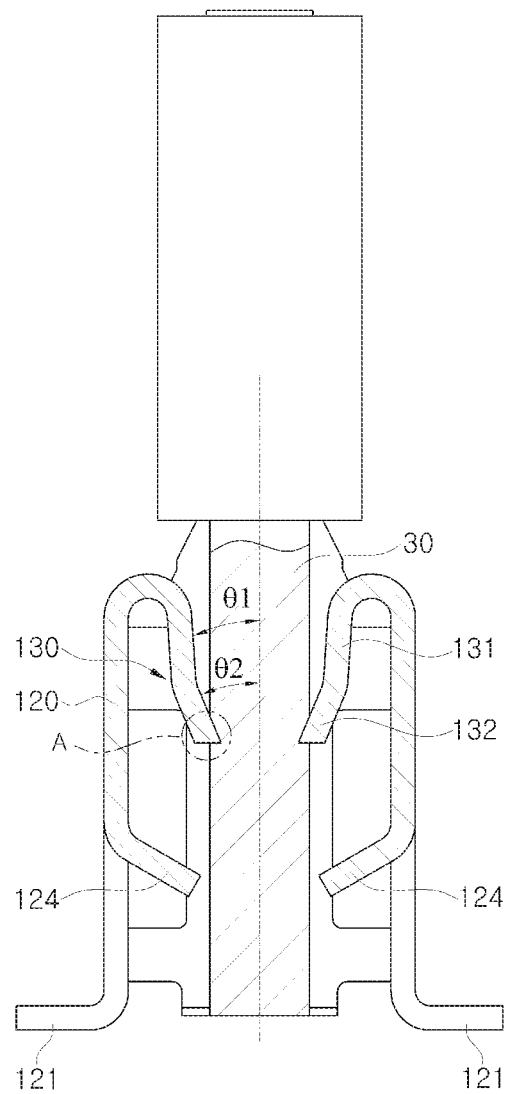
FIG. 6 is a cross-sectional view showing a wire locking structure of the contact terminal according to an exemplary embodiment of the present disclosure.
Figure 7:
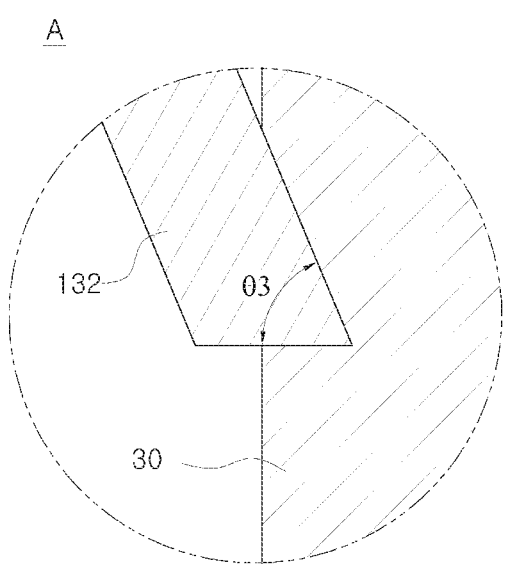
FIG. 7 is a cross-sectional view showing an end of a locking portion of FIG. 6 in detail.

FIG. 3 is a perspective view showing the contact terminal according to an exemplary embodiment of the present disclosure, FIGS. 4 and 5 are a front view and a partial cross-sectional view showing the contact terminal of FIG. 3, FIG. 6 is a cross-sectional view showing a wire locking structure of the contact terminal according to an exemplary embodiment of the present disclosure, and FIG. 7 is a cross-sectional view showing an end of a locking portion of FIG. 6 in detail.

Referring to FIGS. 3 to 5, the contact terminal 100 according to an exemplary embodiment of the present disclosure electrically connects the substrate 20 and the wire 30 with each other by locking the wire 30 in the state in which the contact terminal 100 is mounted on the substrate 20 (see FIG. 2). The contact terminal 100 may be formed by extrusion molding a conductive metal plate, and may be formed in a horseshoe shape (' ⊐ ') by bending both sides of the plate of a sheet shape in parallel in the same direction, and having one side opened (hereinafter, a y direction of the opened one side will be referred to as a "front surface", and the opposite direction, −y direction, will be referred to as a "rear surface."). That is, the contact terminal 100 may include a back plate 110 on the rear surface, one pair of support plates 120 bending from both sides of the back plate 110 in parallel toward the front surface, and one pair of connection plates 130 bending and extended from upper ends of the respective support plates 120 toward a wire insertion space formed inside, and the one pair of support plates 120 and the one pair of connection plates 130 form a symmetrical structure to face each other.

Specifically, the back plate 110 is a terminal support that connects the one pair of support plates 120 and supports the rear surface of the contact terminal 100 and may have a substrate support protrusion 111 formed on a lower end thereof to be supported on the substrate 20, and a housing insertion protrusion 112 formed on an upper end thereof to be inserted into the housing 200. The back plate 110 is supported on the substrate 20 and is coupled to the housing 200 and makes the one pair of support plates 120 symmetrical to each other.

The support plates 120 are terminal supports that are mounted on the substrate 20 and support both sides of the contact terminal 100 and may have mounting portions 121 formed on lower ends thereof and bending in a horizontal direction in parallel with the substrate surface to be mounted on the substrate 20.

The mounting portions 121 are mounted on the mounting pads 21 (see FIG. 2) of the substrate 20, and are electrically connected with the substrate 20, and simultaneously, allow the contact terminal 100 to be stably coupled to the substrate 20, and bend from the one pair of support plates 120 toward the outside. The mounting portions 121 are coupled to the mounting pads 21 by soldering and are soldered at both sides with reference to the back plate 110.

In addition, a coupling portion 122 of a wedge shape protrudes from an end of a front surface of each of the support plates 120 to guide coupling with the housing 200 and to secure the coupling, and a housing insertion protrusion 123 protrudes upward from one side of an upper end of each of the support plates 120 to be inserted into the housing 200.

Accordingly, the back plate 110 and the one pair of support plates 120 may support or couple the contact terminal 100 to the substrate in three directions of the rear surface and both side portions, such that the contact terminal 100 stably stands upright on the substrate and provides a space in an inner space thereof to allow the wire 30 to be inserted and connected.

The connection plates 130 electrically connect the substrate 20 and the wire 30 with each other by guiding insertion of the wire 30 and locking the inserted wire 30. The connection plates 130 bend from upper ends of the one pair of support plates 120 toward the wire insertion space inside to face each other and form a dual contact structure to guide and lock the wire 30 on both sides.

Each of the connection plates 130 includes a first bending portion 131-1 bending downward from the upper end of the support plate 120 toward the inside, an elastic portion 131 extending form the first bending portion, a second bending portion 132-1 bending from an end of the elastic portion toward a center region of the wire insertion space, and a locking portion 132 extending from the second bending portion. The elastic portion 131 provides elasticity to the locking portion 132, such that the locking portion 132 presses the wire 30 with a stronger elastic force and is resistant to plastic deformation as well. The locking portion 132 guides the insertion of the wire 30, is brought into contact with the wire 30 to be electrically connected therewith and locks the inserted wire 30 to prevent the same from being released.

In particular, the connection plate 130 has a two-step bending structure including the first bending portion 131-1 and the second bending portion 132-1. The connection plate 130 of the two-step bending structure elastically presses the wire at the locking portion 132 of the end thereof with a stronger force in comparison to a one-step bending structure and is more resistant to plastic deformation as well.

TABLE 1

| Type | 2 step bending | 1 step bending |
|---|---|---|
| Push (mm) | 0.5 | |
| Force (N) | 7.891 | 4.204 |
| Plasticity (mm) | 0.026 | 0.085 |

That is, as shown in table 1 above, when the locking portion is pushed to have deformation toward one side by a width of 0.5 mm on the assumption that the wire is inserted, deformation is achieved by a force of 4.204 N in the one-step bending structure, but in the two-step bending structure, the deformation by the same width is achieved only when a force of 7.891 N is applied. Therefore, it can be seen that the locking portion of the two-step bending structure shows a stronger pressure.

In addition, plastic deformation according to a restoring state after a push is applied to the locking portion is as follows. The one-step bending structure shows plastic deformation of 0.085 mm, but the two-step bending structure shows plastic deformation of 0.026 mm. Therefore, the locking portion of the two-step bending structure shows an excellent property even in response to plastic deformation.

In this case, it is preferable that an angle $\theta 1$ formed by the elastic portion 131 with respect to the vertical direction is about 8°, and an angle $\theta 2$ formed by the locking portion 132 is about 45°.

In addition, the locking portion 132 may have an extension portion 133 protruding toward the front surface. The extension portion 133 enables the locking portion 132 to have a relatively large width in the front surface direction (y direction), in comparison to the elastic portion 131, and shifts a center axis of the locking portion 132 locking the wire 30 to the front surface. Accordingly, the wire 30 is connected at a location biased relatively toward the front surface with respect to forward and backward directions, and a pick-up surface of a relatively large area may be guaranteed at the side of the rear surface on the upper surface of the housing 200.

In addition, a contact end of the locking portion 132, elastically pressing the wire 30, may have a concave portion which is curved to be concave according to a curvature corresponding to an outer circumference of the wire 30. Accordingly, the wire 30 is inserted along the concave portion, and is prevented from being released from the contact end of the locking portion 132 toward the front surface or rear surface (y or −y direction), such that stable insertion and locking can be achieved. In addition, the concave portion of the locking portion 132 can press the surface of the wire 30 in line contact therewith, thereby further enhancing a retention force of the wire 30.

Each of the support plates 120 is provided with a movement prevention portion 124 which is formed by cutting a portion of the plate between the mounting portion 121 and the locking portion 132, and bends inward. The movement prevention portion 124 prevents the wire 30 connected in the upright position from being tilted.

In general, the wire 30 is inserted between the one pair of locking portions 132 and maintains a connection state in the vertical direction. In this case, since the wire 30 is supported only at one location by the one pair of locking portions 132 with respect to the vertical direction, the wire 30 may be easily tilted in the horizontal direction, in particular, in both side surface directions (x or −x direction). When the wire 30 is tilted repeatedly as described above, the retention force on the locking portions 132 may be greatly degraded, and even the wire 30 may be released from the locking portions 132.

The movement prevention portion 124 is formed by cutting a portion of the support plate 120 at a lower side spaced apart from the locking portion 132 by a predetermined distance, and bends toward the wire insertion space. Accordingly, since the wire 30 is supported at two upper and lower locations by the one pair of locking portions 132 on the upper side and the one pair of movement prevention portions 124 on the lower side, the upright state of the wire 30 can be stably maintained. In this case, the movement prevention portion 124 bends inward while forming a downward inclination to guide the insertion of the wire 30 connected in the upright position.

In the state in which the contact terminal 100 having the above-described configuration is mounted on the substrate in the upright position as shown in FIG. 6, the wire 30 is inserted through the wire insertion port 100a on the upper side, and the ends of the locking portions 132 press the wire 30 in an insertion direction and lock the same.

The ends of the locking portions 132 in contact with the wire 30 form an acute angle of a sharp shape. Accordingly, the ends of the locking portions 132 dig into the surface of the wire 30 with a strong pressure and prevent the wire 30 from being pulled out. In this case, as shown in FIG. 7, it is preferable that an interior angle $\theta 3$ formed by a cross section of each of the ends of the locking portions 132 is 65° to 80°, and more preferably, the angle is about 73°.

TABLE 2

| Sample | Comparison example 1 (50°~65°) | Experiment example (65°~80°) | Comparison example 2 (80°~90°) |
|---|---|---|---|
| 1 | 6.21 | 13.64 | 6.84 |
| 2 | 5.24 | 14.32 | 7.25 |
| 3 | 5.86 | 13.92 | 6.01 |
| 4 | 5.57 | 14.08 | 5.59 |
| 5 | 6.32 | 12.57 | 6.12 |
| 6 | 5.10 | 13.21 | 6.35 |
| 7 | 6.25 | 14.52 | 5.24 |
| 8 | 6.54 | 12.98 | 5.98 |
| 9 | 6.21 | 13.74 | 5.84 |
| 10 | 5.82 | 14.59 | 6.25 |
| min | 5.10 | 12.57 | 5.24 |
| max | 6.54 | 14.59 | 7.25 |
| avg | 5.91 | 13.76 | 6.15 |

Table 2 described above shows a retention force according to an interior angle of the end of the locking portion, and shows a wire retention force according to a certain interior angle between 50° and 65° (comparison example 1), between 65° and 80° (experiment example), and between 80° and 90° (comparison example 2) by a unit of kg·f. As can be seen from table 2, when the interior angle of the end of the locking portion is less than 65° and when the interior angle exceeds 80°, the average retention forces are 5.91 kg·f and 6.15 kg·f, respectively, which are relatively low retention forces. However, when the interior angle is 65° to 80°, the average retention force is 13.79, which is a high retention force. This is because the end of the locking portion 132 may be easily worn down or may not dig into the surface of the wire when the interior angle $\theta 3$ of the end of the locking portion 132 is less than 65° or exceeds 80°, and the retention force is degraded.

Although the present disclosure has been described with reference to embodiments illustrated in the drawings, it will be understood by an ordinary person skilled in the related art that various changes can be made therefrom, and other equivalent embodiments are possible.

What is claimed is:

1. An electrical contact terminal comprising:
   a back plate;
   first and second support plates, the first support plate connected to a first end of the back plate and extending forward from the back plate, the second support plate connected to a second end of the back plate and extending forward from the back plate, the first and second support plates and the back plate defining a wire insertion space therebetween, each support plate having a mounting portion formed on a lower end thereof, each mounting portion being configured to be mounted on a substrate; and first and second connection plates, the first connection plate connected to an upper end of the first support plate, the second connection plate connected to an upper end of the second support plate, the first and second connection plates extending downwardly and inwardly into the wire insertion space, the first and second connection plates being configured to connect and lock a wire that is inserted, in a vertical direction, into the wire insertion space, wherein the first support plate has a first movement prevention portion cut therefrom, the first movement prevention portion extending inwardly into the wire insertion space and being spaced from the first connection plate, and wherein the second support plate has a second movement prevention portion cut therefrom, the second movement prevention portion extending inwardly into the wire insertion space and being spaced from the second connection plate.

2. The electrical contact terminal as defined in claim 1, wherein the first and second movement prevention portions extend downwardly and inwardly into the wire insertion space.

3. The electrical contact terminal as defined in claim 1, wherein each connection plate has a first bending portion bending from an upper of the respective support plate, an elastic portion extending from the first bending portion, a second bending portion bending from an end of the elastic portion, and a locking portion extending from the second bending portion, the locking portion being configured to contact the wire inserted into the wire insertion space in order to lock the wire in place.

4. The electrical contact terminal as defined in claim 3, wherein the first bending portion of each connection plate bends in a concave manner, wherein the elastic portion of each connection plate extends downwardly and inwardly from the first bending portion into the wire insertion space, wherein the second bending portion of each connection plate bends in a convex manner, and wherein the locking portion of each connection plate extends downwardly and inwardly from the second bending portion into the wire insertion space.

5. The electrical contact terminal as defined in claim 3, wherein a cross-section interior angle of an end of each locking portion ranges from 65 degrees to 80 degrees.

6. The electrical contact terminal as defined in claim 3, wherein each connection plate further comprises an extension portion protruding forwardly from the respective locking portion.

7. The electrical contact terminal as defined in claim 1, wherein the electrical contact terminal is formed from a single sheet of material, the first and second support plates bending from the first and second ends of the back plate, respectively, the first and second connection plates bending from the upper ends of the first and second support plates, respectively.

8. An electrical contact terminal comprising:
a back plate;
first and second support plates, the first support plate connected to a first end of the back plate and extending forward from the back plate, the second support plate connected to a second end of the back plate and extending forward from the back plate, the first and second support plates and the back plate defining a wire insertion space therebetween, each support plate having a mounting portion formed on a lower end thereof, each mounting portion being configured to be mounted on a substrate; and first and second connection plates, the first connection plate connected to an upper end of the first support plate, the second connection plate connected to an upper end of the second support plate, the first and second connection plates extending downwardly and inwardly into the wire insertion space, the first and second connection plates being configured to connect and lock a wire that is inserted, in a vertical direction, into the wire insertion space, wherein each connection plate has a first bending portion bending in a concave manner from an upper of the respective support plate, an elastic portion extending downwardly and inwardly from the first bending portion into the wire insertion space, a second bending portion bending in a convex manner from an end of the elastic portion, and a locking portion extending downwardly and inwardly from the second bending portion into the wire insertion space, the locking portion being configured to contact the wire inserted into the wire insertion space in order to lock the wire in place.

9. The electrical contact terminal as defined in claim 8, wherein the first support plate has a first movement prevention portion cut therefrom, the first movement prevention portion extending downwardly and inwardly into the wire insertion space and being spaced from the locking portion of the first connection plate, and wherein the second support plate has a second movement prevention portion cut therefrom, the second movement prevention portion extending downwardly and inwardly into the wire insertion space and being spaced from the locking portion of the second connection plate.

10. The electrical contact terminal as defined in claim 8, wherein a cross-section interior angle of an end of each locking portion ranges from 65 degrees to 80 degrees.

11. The electrical contact terminal as defined in claim 8, wherein each connection plate further comprises an extension portion protruding forwardly from the respective locking portion.

12. The electrical contact terminal as defined in claim 8, wherein the electrical contact terminal is formed from a single sheet of material, the first and second support plates bending from the first and second ends of the back plate, respectively, the first and second connection plates bending from the upper ends of the first and second support plates, respectively.

* * * * *